AUDIO AMPLIFIER INCLUDING CLASS A DRIVER AND CLASS B OUTPUT STAGES

Filed Jan. 3, 1966

INVENTOR
ADELORE F. PETRIE
BY Thomas A. Briody
ATTORNEY

AUDIO AMPLIFIER INCLUDING CLASS A DRIVER AND CLASS B OUTPUT STAGES

INVENTOR
ADELORE F. PETRIE

BY Thomas A. Briody
ATTORNEY

INVENTOR
ADELORE F. PETRIE

BY Thomas A. Briody
ATTORNEY 3,454,889

AUDIO AMPLIFIER INCLUDING CLASS A DRIVER AND CLASS B OUTPUT STAGES

Adelore F. Petrie, Decatur, Ill., assignor to General Electric Company, a corporation of New York Filed Jan. 3, 1966, Ser. No. 518,061
Int. Cl. H03f 3/26
U.S. Cl. 330—15 18 Claims

ABSTRACT OF THE DISCLOSURE

A transistor amplifier having three or more transistors of the same conductivity type, wherein the collector of a first transistor is connected to the base of a second transistor, the emitter of the first transistor is connected to the base of the third transistor, the emitter of the second transistor is connected to the collector of the third transistor, and a diode is connected between the collectors of the first and third transistors so that it will conduct in the forward direction when the second transistor is reverse biased.

This invention relates to a signal amplifier and more particularly to one in which all of the active elements are transistors of the same conductivity type.

Class B signal amplifiers and particularly those used for amplifying aduio frequency signals, while providing efficient operation with relatively low power supply drain, commonly employ transformer networks in the input and output circuits. To eliminate these networks in transistorized amplifier circuits, it has been the practice in the past to use transistor pairs of opposite conductivity type. One disadvantage results from the fact that it is rather difficult to match said pairs since one is not inherently symmetrical to the other. Circuits have been built, however, in which a pair of transistors of the same conductivity type have been used but their use has been limited to the output Class B stages. It has always appeared necessary to drive these stages with a Class A driver in which the driver active element is a transistor of opposite conductivity type. A disadvantage resides in this technique when the amplifier is to be built into a single monolithic chip in what is commonly called an integrated circuit. The use of complementary type transistors complicates the diffusion process. One means of overcoming this latter disadvantage is illustrated in an application of J. I. Rhodes Ser. No. 572,404 entitled, "Audio Amplifier," and filed Aug. 15, 1966. Said application is directed to a Class B signal amplifier in which the Class B output stages as well as the Class A driver therefor include transistors of the same conductivity type. The present invention modifies the amplifier of said application in a manner to obtain a larger output voltage swing.

It is therefore a primary object of the present invention to provide in a signal amplifier, particularly useful in amplifying audio signals, comprising a Class A driver for driving a Class B split-load output wherein the active elements are transistors of the same conductivity type, and means to increase the output voltage swing thereof.

The above and other objects will become apparent from a more detailed description of the accompanying drawings.

Figure 1:
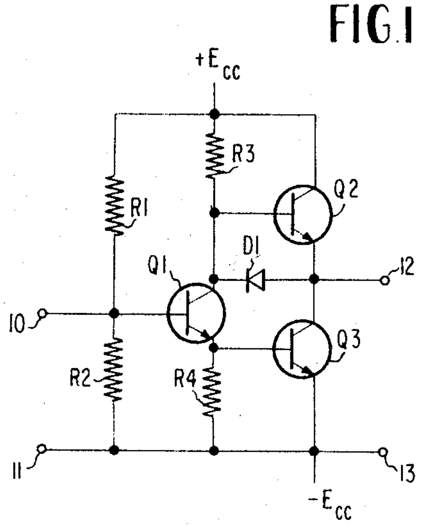
FIGURE 1 is a circuit diagram of one embodiment of the present invention illustrating a phase inverter employing NPN transistors.

Referring first to FIGURE 1, the input of the phase inverter is applied between the terminals 10 and 11 and the output therefrom is taken between the terminals 12 and 13. The power supply is applied as shown and indicated as $+E_{cc}$ and $-E_{cc}$. The bias applied to the base of transistor $Q_1$ is taken from the voltage divider including resistors $R_1$ and $R_2$. The collector of $Q_1$ is connected to $+E_{cc}$ through resistor $R_3$. The emitter of $Q_1$ is connected to $-E_{cc}$ through resistor $R_4$. The colector of $Q_1$ is directly coupled to the base of $Q_2$ and the emitter thereof directly coupled to the base of $Q_3$. The emitter of $Q_2$ is directly coupled to the collector of $Q_3$. The collector of $Q_2$ is connected to $+E_{cc}$ and the emitter of $Q_3$ is connected to $-E_{cc}$. A diode $D_1$ connects the collectors of $Q_1$ and $Q_3$.

The drop across $R_3$ may be approximately half of the supply voltage. The drop across $R_4$ is just sufficient to bias $Q_3$ to small forward current which for Class B operation may be approximately one-half volt for a silicon transistor. $R_3$ should preferably be much larger than $R_4$. $R_1$ and $R_2$ are used to set the bias on $Q_1$ but any standard biasing means may be used. While the circuit is shown in its simplest form, standard variations may be made to include such features as bootstrapping, AC and DC feedback loops, emitter resistors, etc. to meet particular requirements.

The circuit is basically a split-load phase inverter including the Class A driver $Q_1$ direct coupled to a conventional series connected output stage comprising $Q_2$ and $Q_3$ operating in Class B mode. On the positive half of the input cycle, $Q_1$ acts as a common collector stage and drives $Q_3$ as a common emitter stage. On the negative half cycle, $Q_1$ acts as a common emitter stage to drive $Q_3$ as a common collector stage. In this figure, all of the transistors are of the same conductivity type, that is, NPN.

The particular feature to which this invention is directed is embodied in the diode $D_1$ which has its cathode connected to the collector of the Class A driver transistor $Q_1$ and its anode connected to the collector of the Class B output transistor $Q_3$. Note the fact that this prevents the collector voltage of the driver from dropping much below the collector voltage of the output transistor. The amount of this drop is determined by the forward voltage drop of the diode $D_1$. As $Q_3$ begins to conduct when driven by $Q_1$, its base current is added to the normal Class A current of $Q_1$. This extra current flows through $R_3$ causing a large voltage drop which normally lowers the collector voltage of $Q_1$ below that of $Q_3$, limiting the drive that can be applied to $Q_3$. Adding diode $D_1$ as shown here prevents the collector $Q_1$ from swinging more than one volt below the collector of $Q_3$, permitting maximum drive to $Q_3$.

Figure 2:
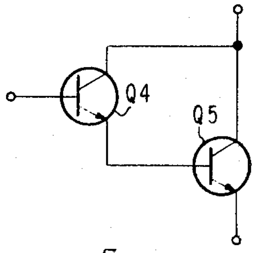
FIGURE 2 and FIGURE 3 represent pairs of transistors, either one of which pairs may be substituted for any of the single transistors as shown in FIGURE 1.

With reference to FIGURE 2, NPN transistors $Q_4$ and $Q_5$ are connected in what is known as a Darlington connected pair with the collectors of $Q_4$ and $Q_5$ directly coupled, the emitter of $Q_4$ connected to the base of $Q_5$.

This pair may be substituted for any one of the transistors shown in FIGURE 1. For instance, if we consider the substitution of this pair for the transistor $Q_1$ in FIGURE 1, the common collectors of $Q_4$ and $Q_5$ would be connected through $R_3$ to $+E_{cc}$ and the emitter of $Q_5$ would be connected to $-E_{cc}$ through resistor $R_4$. The base of $Q_4$ would obtain its bias from the voltage divider including resistors $R_1$ and $R_2$. If the Darlington pair $Q_4$ and $Q_5$ is substituted for the transistor $Q_2$ in FIGURE 1, then the collectors of $Q_4$ and $Q_5$ would be directly coupled to $+E_{cc}$, the emitter of $Q_5$ would be connected to the collector of $Q_3$ and the base of $Q_4$ would be connected to the collector of $Q_1$. A similar substitution can be made for $Q_3$.

Figure 3:
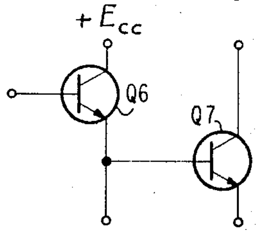

In FIGURE 3 there is shown a pair of transistors $Q_6$ and $Q_7$ and this pair may also be substituted for any of the transistors in FIGURE 1. Basically, the pair involves an emitter follower $Q_6$ preceding any one of the transistors $Q_1$, $Q_2$ or $Q_3$.

Figure 4:
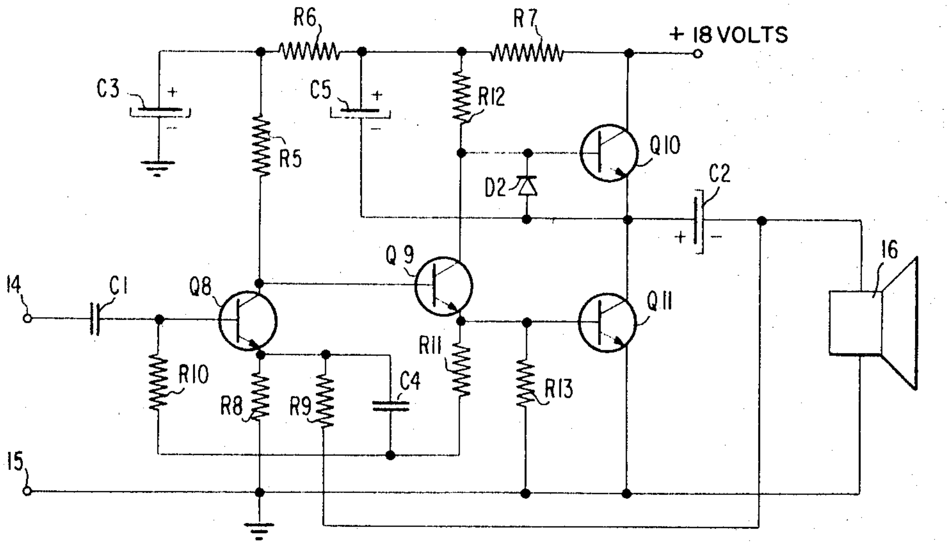
FIGURE 4 is a circuit diagram of still another embodiment of the present invention illustrating a three stage amplifier employing NPN transistors.

Turning now to FIGURE 4, there is shown a two stage amplifier rather than the phase inverter illustrated in FIGURE 1. This circuit is basically similar to that in FIGURE 1, but includes various feedback connections plus the input transistor $Q_8$. $Q_9$ functions similarly to $Q_1$ of FIGURE 1, $Q_{10}$ functions similarly to $Q_2$ of FIGURE 1 and $Q_{11}$ functions similarly to $Q_3$ of FIGURE 1. Diode $D_2$ functions similarly to diode $D_1$ of FIGURE 1. The input to the amplifier is applied between terminals 14 and 15 and the output load is shown here as a loud speaker 16. $+E_{cc}$ is this case is shown as 18 volts, and $-E_{cc}$ is shown as ground. The input signal is applied between terminals 14 and 15 and the output appears across the load. The split-load output Class B stage comprises transistors $Q_{10}$ and $Q_{11}$ connected in series across the power supply. Capacitors $C_1$ and $C_2$ are DC decoupling capacitors and the former may have a value of .1 mfd. and the latter a value of 250 mfd. The collector of $Q_8$ is connected through the 100K resistor $R_5$ to the 10K resistor $R_6$. The other end of $R_6$ is connected to the 470 ohm resistor $R_7$. The other end of $R_7$ is connected to the 18 volt supply. The 10 mfd. capacitor $C_3$ is connected from one end of $R_5$ to ground, for bypassing alternating current to ground.

The collector of $Q_8$ is directly coupled to the base of $Q_9$. The emitter of $Q_8$ is connected first through the 100 ohm resistor $R_8$ to ground, second through the 4.7K resistor $R_9$ to one side of the load 16 and third through the .47 mfd. capacitor $C_4$ to the mid point of a voltage divider including the 22K resistor $R_{10}$ and the 22K resistor $R_{11}$. This voltage divider is connected between the base of $Q_8$ and the emitter of $Q_9$.

The collector of $Q_9$ is connected through the 680 ohm resistor $R_{12}$ to resistor $R_7$ as shown. The collector of $Q_9$ is also directly coupled to the base of $Q_{10}$. The collector of $Q_{10}$ is directly connected to +18 volts. The emitter of $Q_9$ is directly coupled to the base of $Q_{11}$ and through the 100 ohm resistor $R_{13}$ to ground. The emitter of $Q_{10}$ is directly coupled to the collector of $Q_{11}$. The diode $D_2$ has its cathode connected to the collector of $Q_9$ and its anode to the collector of $Q_{11}$. Note the inclusion of the capacitor $C_5$ connected between $R_6$ and the plate of diode $D_2$. $C_5$ is a bootstrap capacitor providing positive feedback for increased drive to $Q_{10}$, and may have a value of 50 mfd. It should also be noted that capacitors $C_2$, $C_3$ and $C_5$ may be electrolytic capacitors.

Various connections shown between $Q_8$ and $Q_9$ involving the resistors and capacitors in the base and emitter circuits thereof function as feedback loops. This is also true of the connection between the output and the emitter of $Q_8$ including the resistor $R_9$.

The input transistor $Q_8$ functions as a common-emitter signal amplifier and as previously stated $Q_9$, $Q_{10}$ and $Q_{11}$ function similarly to their counterparts $Q_1$, $Q_2$ and $Q_3$ respectively in FIGURE 1. All of the transistors shown in this figure are NPN transistors. As in FIGURE 1, if the transistors employed are PNP transistors then the polarity of the power supply connections are reversed.

Figure 5:
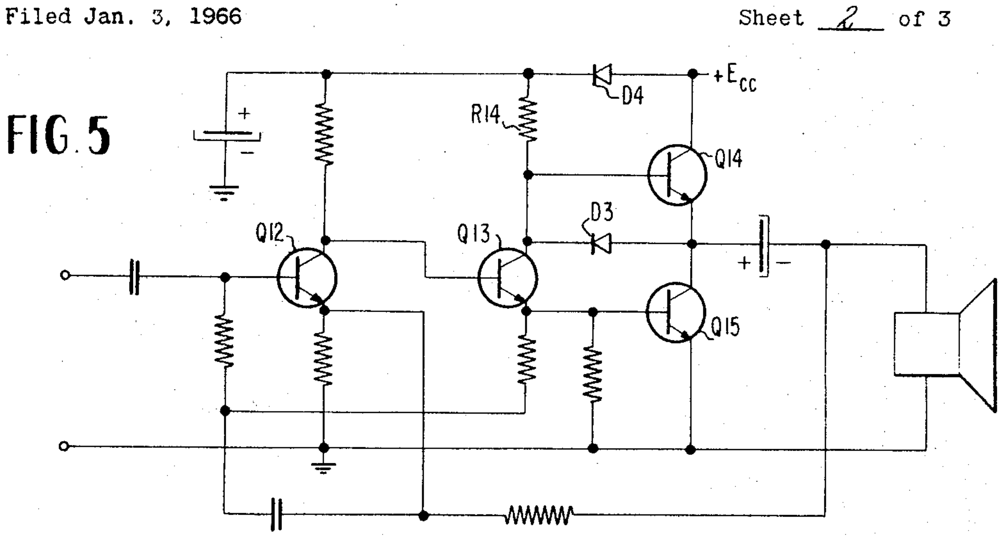
FIGURE 5 is simiuar to FIGURE 4 but showing a slightly different circuit arrangement.

FIGURE 5 is similar to FIGURE 4 with the transistors $Q_{12}$, $Q_{13}$, $Q_{14}$ and $Q_{15}$ functioning similarly to their counter parts $Q_8$, $Q_9$, $Q_{10}$ and $Q_{11}$ in FIGURE 4. The diode $D_3$ in FIGURE 5 functions similarly to the diode $D_2$ in FIGURE 4 but note the addition of diode $D_4$ having its anode directly connected to the collector of $Q_{14}$ and its cathode through the 1K resistor $R_{14}$ to the collector of $Q_{13}$. $D_4$ functions as a power supply filter. The load again is shown as a loud speaker.

Figure 6:
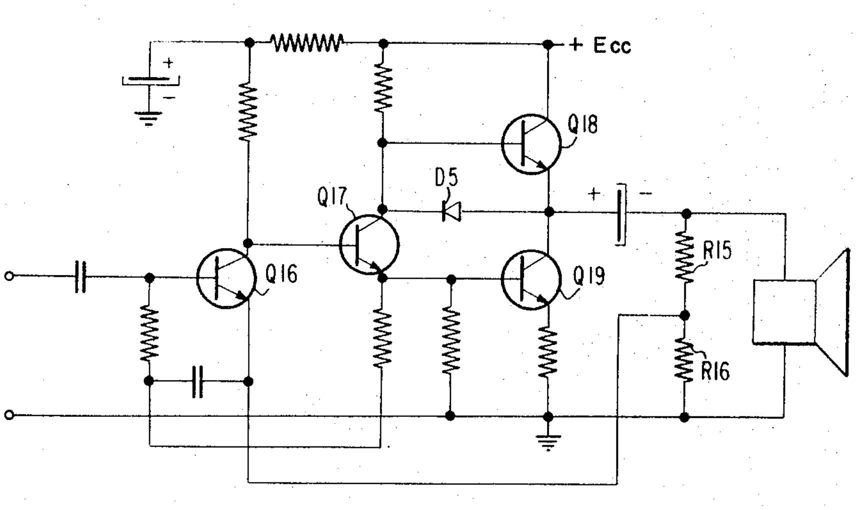
FIGURE 6 is similar to FIGURE 4 but again showing another circuit arrangement.

Another embodiment of a three stage amplifier is shown in FIGURE 6 and it again is similar to the circuit of FIGURE 4 with slightly different connections and values of components. Note the feedback from the voltage divider $R_{15}$ and $R_{16}$ across the output to the emitter of the input transistor $Q_{16}$. Transistors $Q_{16}$, $Q_{17}$, $Q_{18}$ and $Q_{19}$ function similarly to their counterparts in FIGURE 4, namely $Q_8$, $Q_9$, $Q_{10}$ and $Q_{11}$. Diode $D_5$ functions similarly to diode $D_2$.

Figure 7:
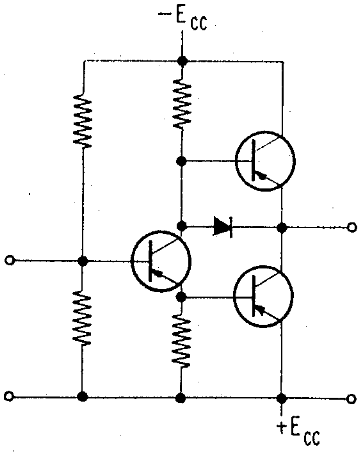
FIGURE 7 is a circuit diagram similar to FIGURE 1 but illustrating the use of PNP transistors.

Again, it should be noted that in any of the circuits illustrated in FIGURES 1, 4, 5 and 6, any one of the transistors shown may be replaced as previously discussed by the pairs of transistors shown in FIGURES 2 and 3. Additionally, in any of the circuits, while NPN transistors are shown, PNP transistors may be used by simply reversing the polarity of the supply voltage connections. In this latter connection, reference is made to FIGURE 7 which is identical to FIGURE 1 except that PNP transistors are used instead of NPN transistors.

Figure 8:
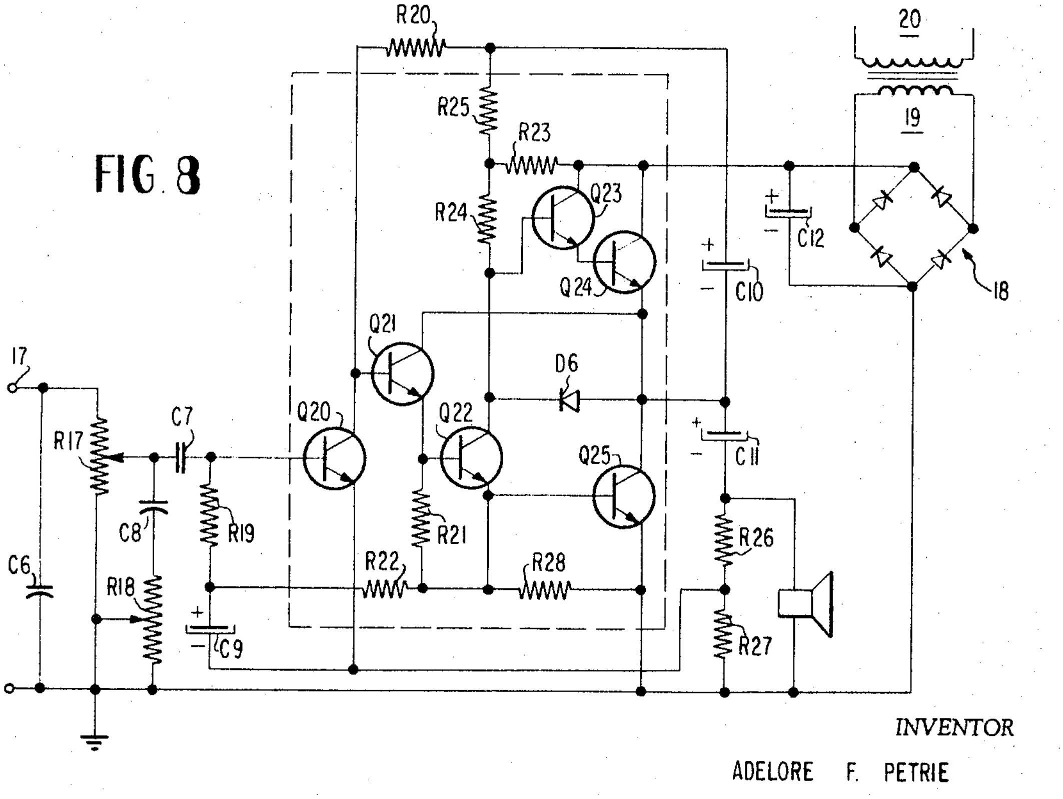
FIGURE 8 is a circuit diagram illustrating another form of the present invention in which the invention is incorporated into an integrated circuit.

FIGURE 8 is another embodiment of the present invention finding particular utility as an integrated circuit. The conventional diode bridge 18 rectifies the AC signal on the secondary 19 of the transformer which is coupled to the primary 20 thereof. The output appears across capacitor C12. The input signal is applied between ground and terminal 17 across capacitor C6 and the potentiometer R17 in parallel therewith. The input signal is taken from the wiper associated with the potentiometer R17 and is applied across capacitor C8 and the potentiometer R18. Note the fact that the potentiometer R18 may be adjusted to vary the RC impedance of the input. The input signal is coupled through capacitor C10 to the base of transistor Q20. Q20 is a standard grounded emitter voltage amplifier stage with negative feedback applied to the emitter thereof from the voltage divider across the output. This voltage divider is composed of R26 and R27 and across this voltage divider is connected the output load which in this case is diagrammatically illustrated as a loudspeaker. Note that the base emitter circuit of Q20 also includes R19 and capacitor C9.

Q21 is an emitter-follower which drives Q22. The base of Q21 is directly connected to the collector of Q20. Q22 is a split-load phase inverter with unequal loads in its emitter and collector circuits. The collector of Q22 is directly connected to the base of Q23 which functions as an emitter-follower driving Q24. It was added to reduce the drive required by Q24 and therefore the idle current of Q22. Q24 is a Class B emitter-follower output stage that takes care of the positive half of the output swing. Q25 is a Class B grounded emitter stage which takes care of the negative half of the output swing having the base thereof directly connected to the emitter of Q22. The diode D6 is connected so that it conducts when Q22 draws large currents and prevents its collector from falling more than one volt below the potential of the collector of Q25. This allows more drive to be applied to Q25 and therefore larger output swings.

The basic system used in this amplifier is to balance the base emitter voltage of Q20 against the base emitter voltage of Q25 and thereby control the idle current through Q25. DC-wise, the emitters of both Q20 and Q25 are returned to ground and the base of Q25 is returned to the base of Q20 through R22 and R19. Note the fact that R28 connects the emitter of Q22 to ground. R21 connects the base of Q22 to its emitter, increasing the current through Q21 to keep it out of cut-off.

Since the base emitter voltage of Q20 is a function of the collector current, it can be controlled by adjusting the size of R20. If the base emitter voltage of Q20 and Q25 are the same, as they are in this particular circuit, controlling the collector current of Q20 sets the collector current of Q25. Temperature tracking is ideal since the two base emitter diodes will have similar temperature characteristics that will be maintained at the same temperature in an integrated circuit. With a regulated base emitter voltage on Q25, R28 determines the emitter current of Q22. This same current flows through R23 and R24 which resistors are connected in the base collector circuit of Q23. This determines the collector voltage of Q22 and therefore the center point output voltage through the emitter-followers Q23 and Q24.

The collector of Q20 is connected through R20 and R25 to the junction of R23 and R24. The output of the power supply is applied directly to the collectors of Q23 and Q24. R20 is connected to capacitor C10 which in turn is connected to the output from the Class B stages which is obtained from the common connection between Q24 and Q25. C11 couples the output to the load (e.g. speaker).

The input impedance of the amplifier is raised by bootstrapping the base resistor of Q20 to its emitter. This is the function of capacitor C9. Full drive for the output transistor Q24 in the positive direction is accomplished by bootstrapping achieved by capacitor C10. This also reduces power supply ripple coming through R23.

Class B idle current control in the two output transistors Q24 and Q25 is accomplished by means of the aforementioned base-emitter DC feedback path. However, if too much voltage drop is allowed in the base or emitter circuits of Q20, R20 must be raised to such a high value that Q20 becomes starved and rectification takes place in the base circuit causing a shift in the bias levels with input signal. This can be recognized by a shift in the level of the common connection between Q24 and Q25. This shift is in the positive direction during application of the signal. An imbalance between the positive and negative halves of the output signal also causes shift in the center point during application of the signal even though the non-linearities are concealed by a high negative feedback. With an output bootstrapping capacitor such as C10, the positive half of the output cycle tends to have more gain than the negative half. To compensate for this, R25 is connected in series to limit the bootstrapping and thereby balance the outputs. This also helps to reduce cross-over distortion since cross-over distortion is multiplied by the amount of bootstrapping.

Positive feedback through the power supply is minimized by returning the collector resistor of Q20 to R25 instead of back to the power supply. This provides sufficient negative feedback to Q20 to compensate for the positive feedback through the power supply.

Figure 9:
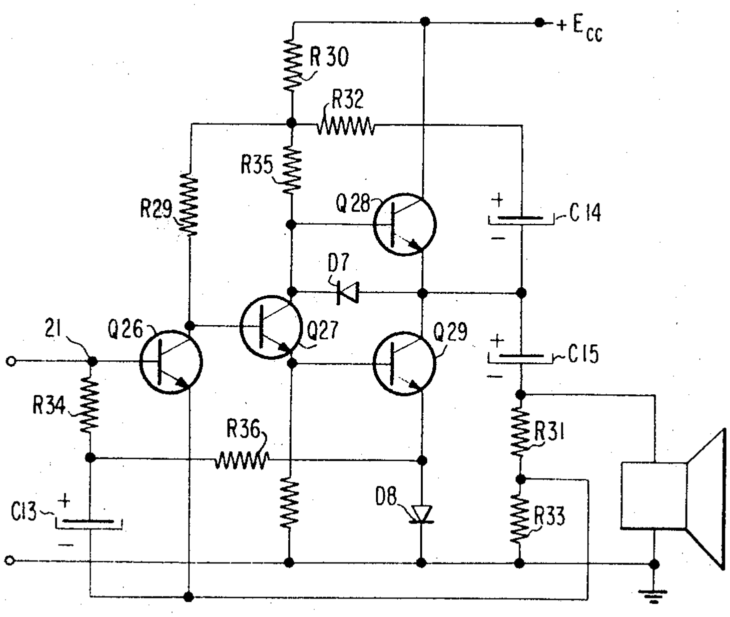
FIGURE 9 is a circuit diagram of still a further embodiment of the invention in which the circuit is composed of discrete components.

FIGURE 9 illustrates still a further embodiment of the present invention in which discrete circuit components are used. The input signal is applied to the base of Q26 which functions essentially as a standard grounded emitter voltage amplifier stage with negative feedback to the emitter thereof from the voltage divider R31, R33, across the output. R34 and C13 function similarly to R19 and C9 of FIGURE 8. The collector of Q26 is directly connected to the base of Q27. The collector of Q27 is directly connected to the base of Q28. The emitter of Q27 is directly connected to the base of Q29. Q27, Q28 and Q29 function similarly to Q22, Q24 and Q25 in FIGURE 8. Diode D7 functions similarly to diode D6. The diode D7 has its cathode connected to the collector of Q27 and its anode connected to the collector of Q29. The emitter of Q28 is directly connected to the collector of Q29 and the emitter of Q29 is connected through diode D8 to ground. The emitter of Q27 is connected through a resistor to ground. The collector of Q27 is also connected to the positive terminal of the power supply $E_{cc}$ through R35 and R30. The junction between these two resistors is connected through R29 to the collector of Q26 and through R32 and capacitor C14 to C15. These capacitors function similarly to C10 and C11 in FIGURE 8. The load again is shown diagrammatically as a loudspeaker across the voltage divider.

In this circuit, which employs discrete components as distinct from an integrated circuit, the emitter-followers of FIGURE 8 have been omitted due to the high gain of the transistors and the silicon diode D8 is added in the emitter of Q29. It should be noted that the DC feedback to the base of Q26 through R34 and R36 is taken across this diode D8 rather than from the base of Q29.

This is done since there is no thermal connection between input and output transistors as in the integrated circuit. Without this thermal connection, heating of the output transistor would cause a decrease in the base-emitter voltage of the output transistor so that it would not be compensated with the input transistor. The silicon diode added in the emitter circuit has very little power dissipation and therefore its temperature does not rise much above the ambient temperature. In this case, ambient temperature makes a thermal connection between this diode and the input transistor, thus achieving the required thermal tracking.

What has been shown are various embodiments of the present invention. Other embodiments obvious from the teachings herein to those skilled in the art are contemplated to be within the spirit and scope of the invention.

What is claimed is:

1. In a Class B signal amplifier including first, second and third transistors of the same conductivity type, each having base, collector and emitter electrodes, means connecting said second and third transistors in series for direct current as a Class B output stage for said amplifier, means providing an output signal connected to the emitter of said second transistor and the collector of said third transistor, a Class A driver stage including said first transistor, means directly connecting the collector of said first transistor to the base of said second transistor, means directly connecting said emitter electrode of said first transistor to the base of said third transistor and signal input means connected to the base of said first transistor, said first transistor being operative on one half cycle of the applied input signal as a common emitter signal amplifier to drive said second transistor as a common collector signal amplifier and as a common collector signal amplifier on alternate half cycles of the applied input signal to drive said third transistor as a common emitter signal amplifier; the improvement that comprises a diode connected between said collector of said first transistor and said collector of said third transistor.

2. An amplifier as defined in claim 1 further including an emitter resistor connected to the emitter of said first transistor and across the base-emitter of said third transistor.

3. An amplifier as defined in claim 2 wherein said transistors are NPN.

4. An amplifier as defined in claim 2 wherein said transistors are PNP.

5. An amplifier as defined in claim 2 wherein at least one of said transistors is substituted by a Darlington pair of transistors.

6. An amplifier as defined in claim 2 further including an emitter follower in the input circuit to at least one of said transistors.

7. In a Class B signal amplifier including first, second, third and fourth transistors of the same transistor type each having base, collector and emitter electrodes, means connecting said second and third transistors in series for direct current as a Class B output stage for said amplifier, means providing an output circuit connected to the emitter of said second transistor and to the collector of said third transistor, a Class A driver stage including said first transistor, means directly connecting the collector of said first transistor to the base of said second transistor, means directly connecting said emitter of said first transistor to the base of said third transistor, signal input means connected to the base of said fourth transistor, means connecting the collector of said fourth transistor to the base of said first transistor, said fourth transistor being operative on both half cycles of the applied input signal as a common emitter signal amplifier to drive said first transistor, said first transistor being operative on one half cycle of the applied input signal as a common emitter signal amplifier to drive said second transistor as a common collector signal amplifier and as a common collector signal amplifier on alternate half cycles of the applied input signal to drive said third transistor as a common emitter signal amplifier; the improvement that comprises a diode connected between said collector of said first transistor and said collector of said third transistor.

8. An amplifier as defined in claim 7 wherein said transistors are NPN.

9. An amplifier as defined in claim 7 wherein said transistors are PNP.

10. An amplifier as defined in claim 7 further including an emitter resistor connected to the emitter electrode of said first transistor and across the base-emitter of said third transistor.

11. An amplifier as defined in claim 8 with the further improvement that comprises a first emitter-follower transistor connecting the collector of said first transistor to the base of said second transistor, a second emitter-follower transistor connecting the collector of said fourth transistor to the base of said first transistor and means connecting the collector of said second emitter-follower to the emitter of said second transistor.

12. An amplifier as defined in claim 8 with the further improvement that comprises a DC feedback loop connected between the emitter of said third transistor and the base of said fourth transistor and a thermal tracking diode in series with the emitter of said third transistor.

13. An amplifier as defined in claim 10 wherein at least one of said transistors is substituted by a Darlington pair of transistors.

14. An amplifier as defined in claim 10 further including an emitter-follower in the input circuit to at least one of said transistors.

15. An amplifier as defined in claim 10 further including a voltage divider connected across said output circuit connected to the emitter of said fourth transistor.

16. An amplifier as defined in claim 10 further including a DC feedback loop connected between the base of said fourth transistor and the emitter of said first transistor.

17. An amplifier as defined in claim 11 further including a first bootstrapping capacitor connected in the base-emitter circuit of said fourth transistor and a second bootstrapping capacitor connected in the base circuit of said first emitter-follower transistor.

18. An amplifier as defined in claim 12 further including a first bootstrapping capacitor connected in the base-emitter circuit of said fourth transistor and a second bootstrapping capacitor connected in the base circuit of said first emitter-follower transistor.

References Cited

Furst: "Design of a High-Quality Transistor Power Amplifier," Electronics World, February 1964, pp. 34, 35, 76.

Lin et al.: "Single-Ended Amplifiers for Class B Operation," Electronics, May 29, 1959, pp. 86, 87.

ROY LAKE, *Primary Examiner.*

S. H. GRIMM, *Assistant Examiner.*

U.S. Cl. X.R.

330—18, 19, 20, 24, 25